US012736162B2

(12) United States Patent
Lin

(10) Patent No.: US 12,736,162 B2
(45) Date of Patent: Sep. 15, 2026

(54) JOINT AUXILIARY ASSEMBLY AND JOINT ASSEMBLY

(71) Applicant: WISTRON CORP., New Taipei City (TW)

(72) Inventor: Yu Wei Lin, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 102 days.

(21) Appl. No.: 19/023,567

(22) Filed: Jan. 16, 2025

(65) Prior Publication Data

US 2026/0126141 A1 May 7, 2026

(30) Foreign Application Priority Data

Nov. 6, 2024 (TW) ................................ 113142535

(51) Int. Cl.
*F16L 37/086* (2006.01)
*F16L 37/413* (2006.01)
*H05K 7/20* (2006.01)

(52) U.S. Cl.
CPC ........... *F16L 37/086* (2013.01); *F16L 37/413* (2013.01); *H05K 7/20272* (2013.01); *F16L 2201/30* (2013.01)

(58) Field of Classification Search
CPC ..... F16L 29/007; F16L 37/086; F16L 37/413; F16L 2201/30; F16K 13/02; F16K 13/08; G01M 3/183; H05K 7/20272
See application file for complete search history.

(56) References Cited

U.S. PATENT DOCUMENTS

| | | | | |
|---|---|---|---|---|
| 9,341,316 | B2 * | 5/2016 | Novak | F17D 5/005 |
| 10,365,667 | B2 * | 7/2019 | Lyon | G06F 1/206 |
| 2004/0188069 | A1 * | 9/2004 | Tomioka | G06F 1/203 257/E23.098 |

(Continued)

FOREIGN PATENT DOCUMENTS

| | | |
|---|---|---|
| CN | 110775306 A | 2/2020 |
| CN | 117905976 A | 4/2024 |
| CN | 118532629 A | 8/2024 |

OTHER PUBLICATIONS

TW Office Action dated May 6, 2025 in Taiwan application No. 113142535.

*Primary Examiner* — Reinaldo Sanchez-Medina
(74) *Attorney, Agent, or Firm* — McClure, Qualey & Rodack, LLP

(57) ABSTRACT

A joint auxiliary assembly and a joint assembly, where the joint auxiliary assembly includes mounting barrel, first elastic component, restricting barrel, electronic control assembly and liquid detecting unit. A side of the mounting barrel has blocking portions, and mounting barrel is connected to first joint. First elastic component is disposed in mounting barrel. An end of first elastic component presses against blocking portions. Restricting barrel is movably disposed on mounting barrel. Blocking portions are surrounded by restricting barrel and rest on restricting barrel. Electronic control assembly is disposed on mounting barrel. At least a portion of liquid detecting unit is disposed on mounting barrel, and liquid detecting unit is connected to electronic control assembly. Electronic control assembly is configured to move blocking portions by moving restricting barrel based on liquid detecting unit.

20 Claims, 7 Drawing Sheets

(56) References Cited

U.S. PATENT DOCUMENTS

| | | | | |
|---|---|---|---|---|
| 2011/0313576 | A1* | 12/2011 | Nicewonger ...... | H05K 7/20781 361/701 |
| 2025/0331130 | A1* | 10/2025 | Wu ........................ | G06F 1/181 |
| 2026/0059701 | A1* | 2/2026 | Serwin ................ | F16K 31/0651 |

* cited by examiner 351
353
352
A
360
330
313
313
100
320
210
200
10

JOINT AUXILIARY ASSEMBLY AND JOINT ASSEMBLY

CROSS-REFERENCE TO RELATED APPLICATIONS

This non-provisional application claims priority under 35 U.S.C. § 119(a) on Patent Application No(s). 113142535 filed in Taiwan, R.O.C. on Nov. 6, 2024, the entire contents of which are hereby incorporated by reference.

TECHNICAL FIELD

The disclosure relates to a joint auxiliary assembly and a joint assembly, more particularly to a joint auxiliary assembly and a joint assembly including at least one electronic control assembly.

BACKGROUND

Due to the high specific heat capacity of liquid, a liquid-cooling system is widely used to cool an electronic device, such as a server. In order to prevent the electronic device from being damaged due to the leakage of the working liquid in the liquid-cooling system, a solenoid valve is usually disposed in the tubing of the liquid-cooling system, so as to close the tubing when the leakage of the working liquid is detected. Specifically, the solenoid valve includes a solenoid and a plunger, and the solenoid is configured to drive the plunger to close or open the tubing of the liquid-cooling system.

However, the plunger of the solenoid valve is located in the tubing and thus is subjected to the pressure generated by the working fluid flowing in the tubing. Thus, the plunger of the solenoid valve is required to have large volume to be moved in the tubing by overcoming the said pressure, which enlarges the volume of the solenoid valve. In this way, the space utilization of the space for accommodating the liquid-cooling system is inefficient.

SUMMARY

The disclosure provides a joint auxiliary assembly of small volume and a joint assembly including the same.

One embodiment of this disclosure provides a joint auxiliary assembly configured to detach a first joint and a second joint and including a mounting barrel, a first elastic component, a restricting barrel, an electronic control assembly and a liquid detecting unit. A side of the mounting barrel has a plurality of blocking portions, and the mounting barrel is configured to be connected to the first joint. The first elastic component is disposed in the mounting barrel. An end of the first elastic component presses against the plurality of blocking portions. The restricting barrel is movably disposed on the mounting barrel along an axial direction of the mounting barrel. The plurality of blocking portions is surrounded by the restricting barrel and rests on the restricting barrel. The electronic control assembly is disposed on the mounting barrel. At least a part of the liquid detecting unit is disposed on the mounting barrel, and the liquid detecting unit is connected to the electronic control assembly. The electronic control assembly is configured to move the plurality of blocking portions by moving the restricting barrel based on the liquid detecting unit.

Another embodiment of this disclosure provides a joint assembly including a first joint, a second joint and a joint auxiliary assembly. The second joint is jointed to the first joint. The joint auxiliary assembly includes a mounting barrel, a first elastic component, a restricting barrel, an electronic control assembly and a liquid detecting unit. A side of the mounting barrel has a plurality of blocking portions, and the mounting barrel is connected to the first joint. The first elastic component is disposed in the mounting barrel. An end of the first elastic component presses against the plurality of blocking portions. The restricting barrel is movably disposed on the mounting barrel along an axial direction of the mounting barrel. The plurality of blocking portions is surrounded by the restricting barrel and rests on the restricting barrel. The electronic control assembly is disposed on the mounting barrel. At least a part of the liquid detecting unit is disposed on the mounting barrel, and the liquid detecting unit is connected to the electronic control assembly. The electronic control assembly is configured to move the plurality of blocking portions by moving the restricting barrel based on the liquid detecting unit.

According to the joint auxiliary assembly and the joint assembly disclosed by above embodiments, the restricting barrel is movably disposed on the mounting barrel along the axial direction of the mounting barrel, the blocking portions are surrounded by the restricting barrel and rest on the restricting barrel, and at least a part of the liquid detecting unit is disposed on the mounting barrel and connected to the electronic control assembly. Thus, the electronic control assembly is allowed to move the restricting barrel based on the liquid detecting unit so as to move the blocking portions, thereby detaching the first joint and the second joint from each other by the first elastic component. Thus, when the working liquid is leaked from the position where the first joint and the second joint are jointed, the first joint and the second joint are detached from each other, and thus the leaked working liquid is prevented from damaging the adjacent electronic component(s). Meanwhile, the entire of the joint auxiliary assembly are disposed outside the first joint and the second joint, and thus the joint auxiliary assembly is not subjected to the pressure generated by the working liquid. Thus, comparing to conventional solenoid valves, the joint auxiliary assembly according to the disclosure not only immediately detaches the first joint and the second joint from each other when the leakage occurs, but also have smaller volume to allow the space utilization of the space accommodating the liquid system including the first joint and the second joint to be efficient.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
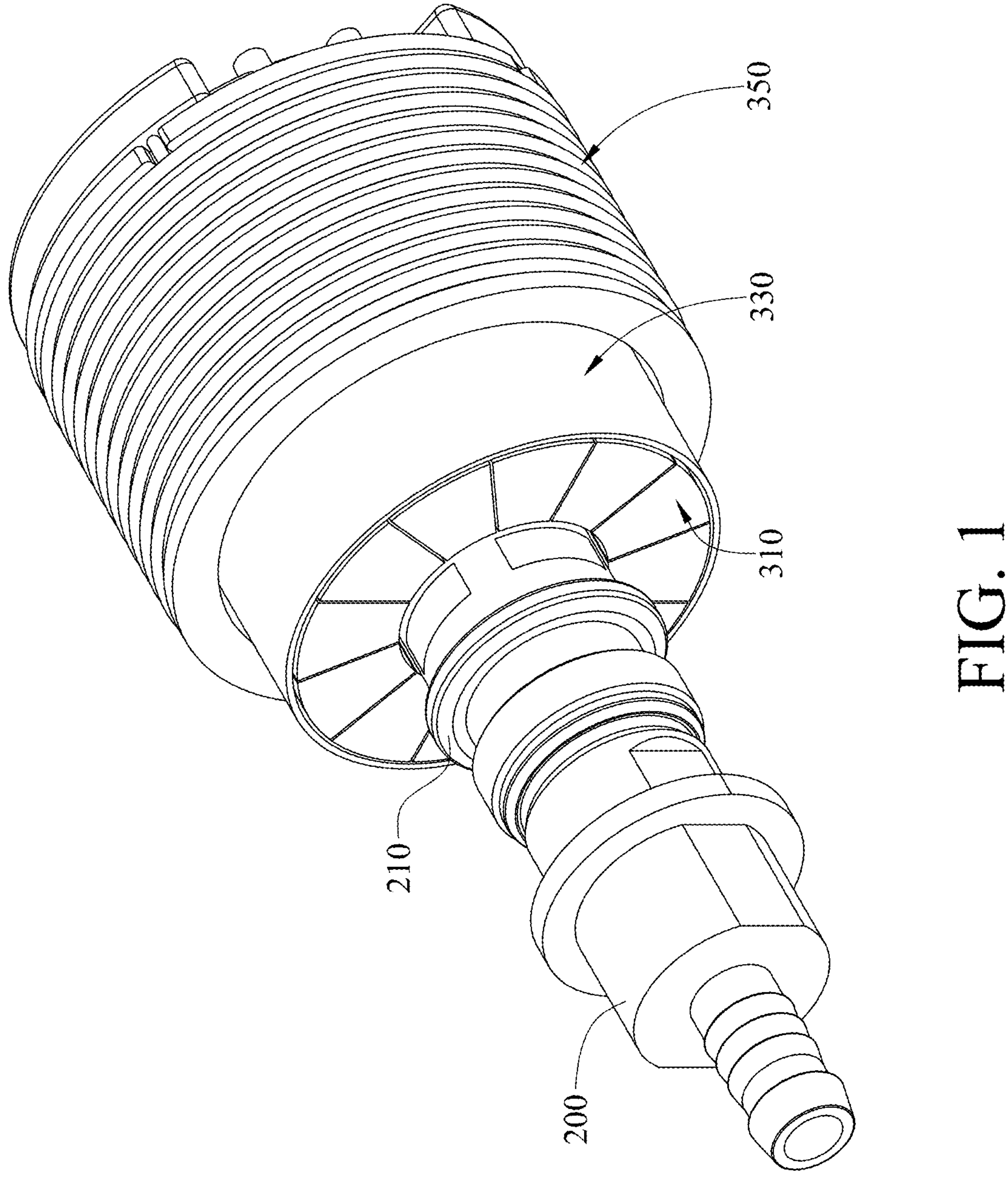
FIG. 1 is a perspective view of a joint assembly according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
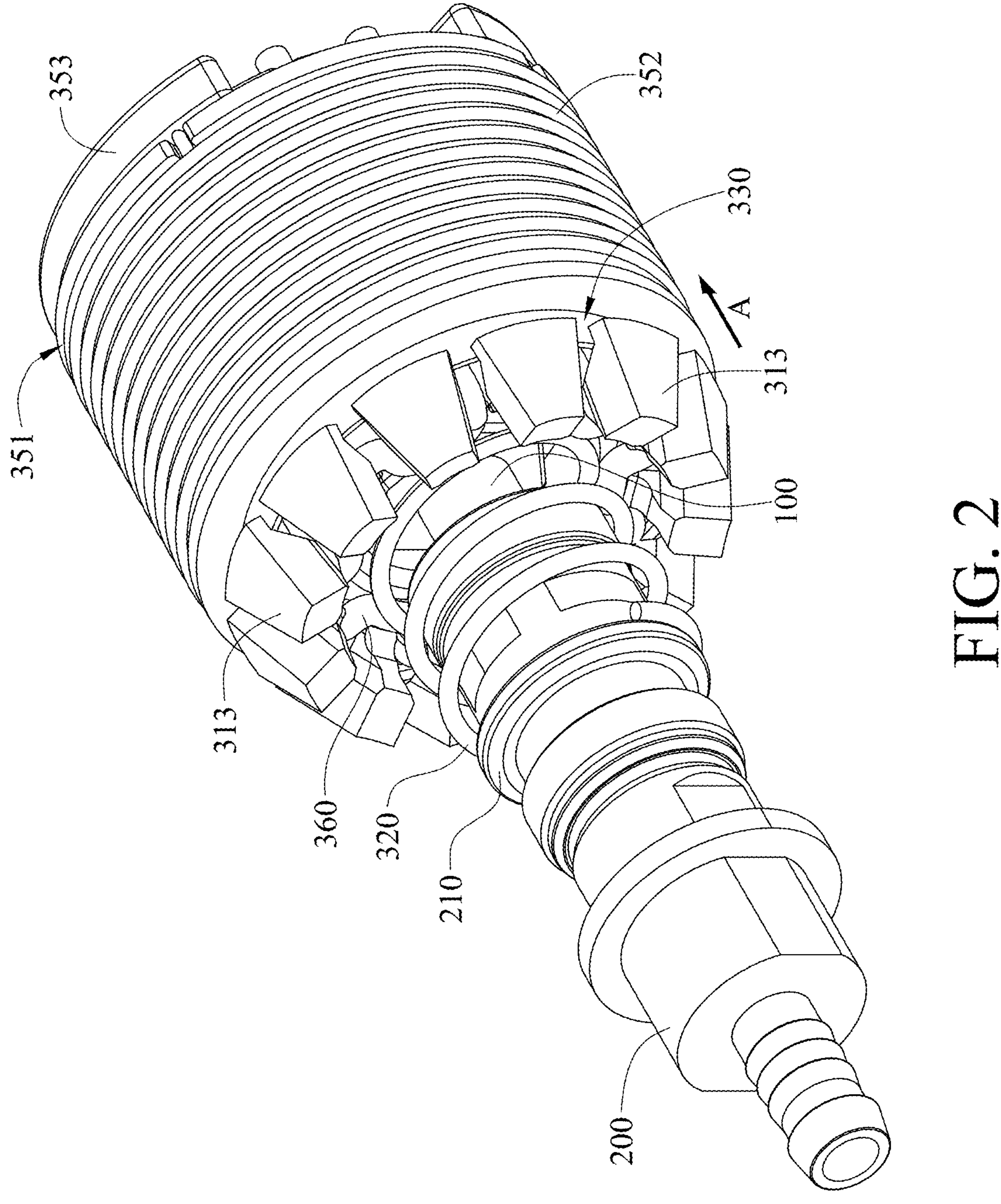
FIG. 2 is a perspective view showing that a joint auxiliary assembly of the joint assembly in FIG. 1 detaches a first joint and a second joint from each other.
Figure 3:
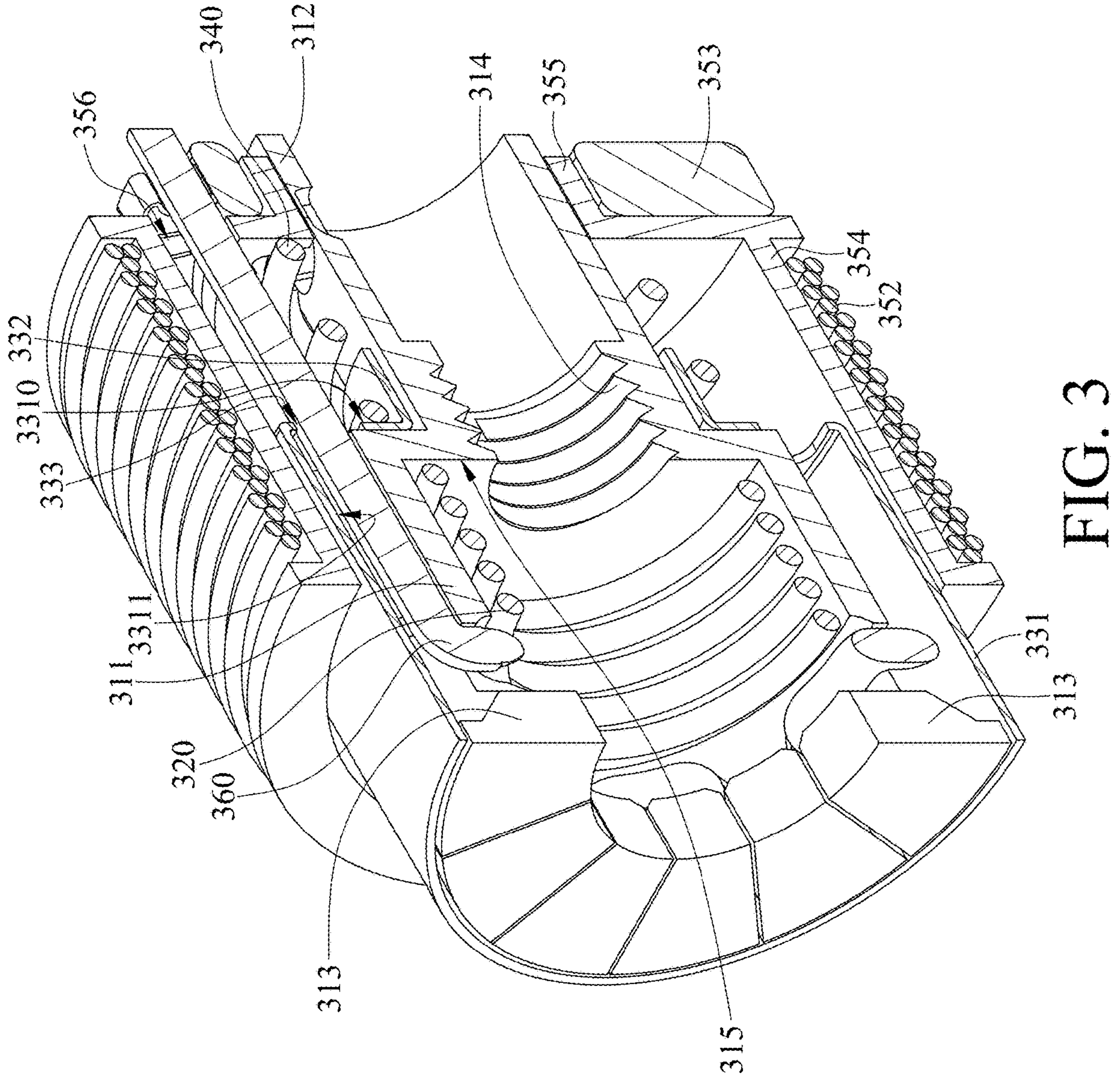
FIG. 3 is a perspective cross-sectional view of the joint auxiliary assembly of the joint assembly in FIG. 1.
Figure 4:
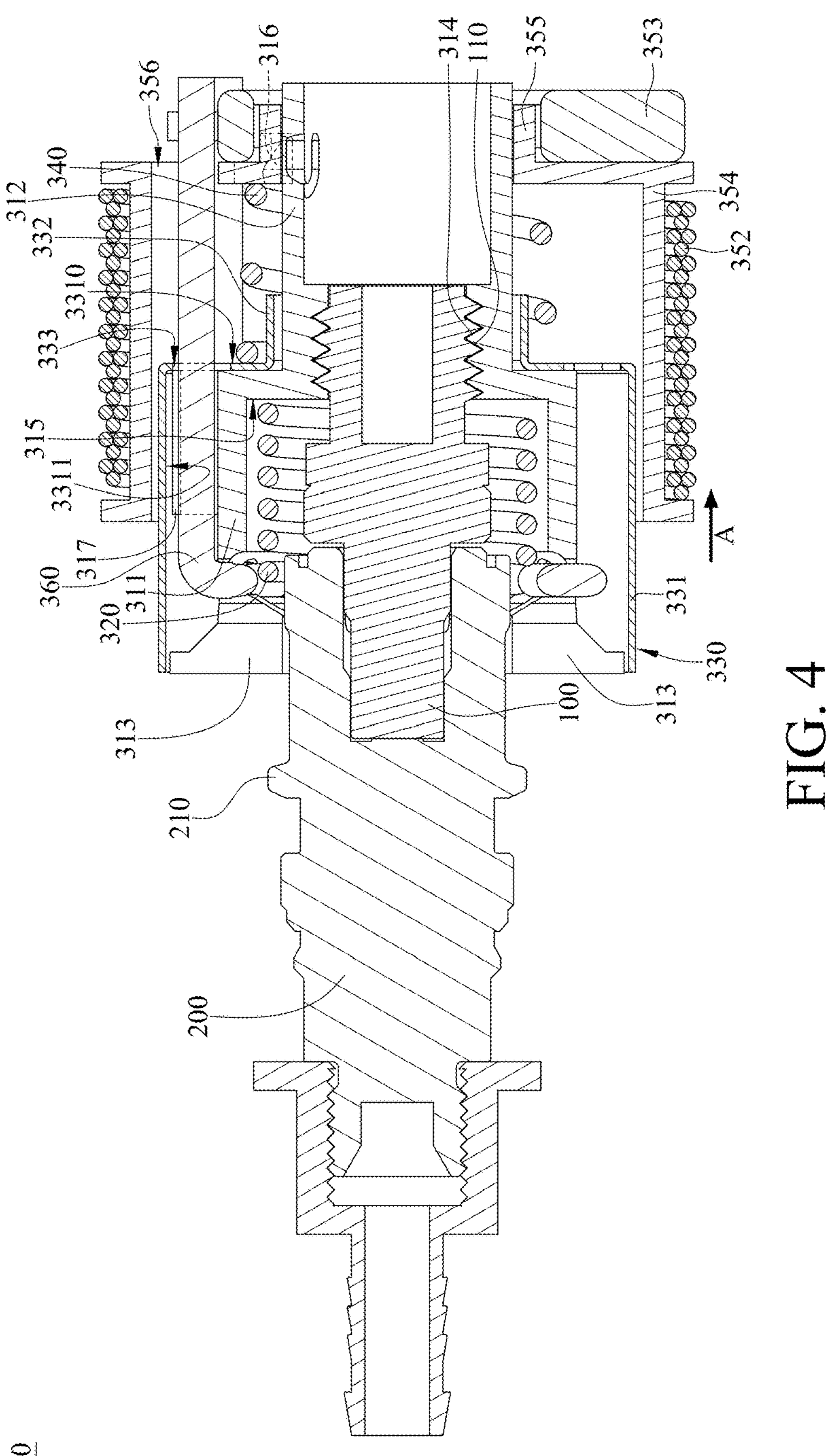
FIG. 4 is a side cross-sectional view of the joint assembly in FIG. 1.
Figure 5:
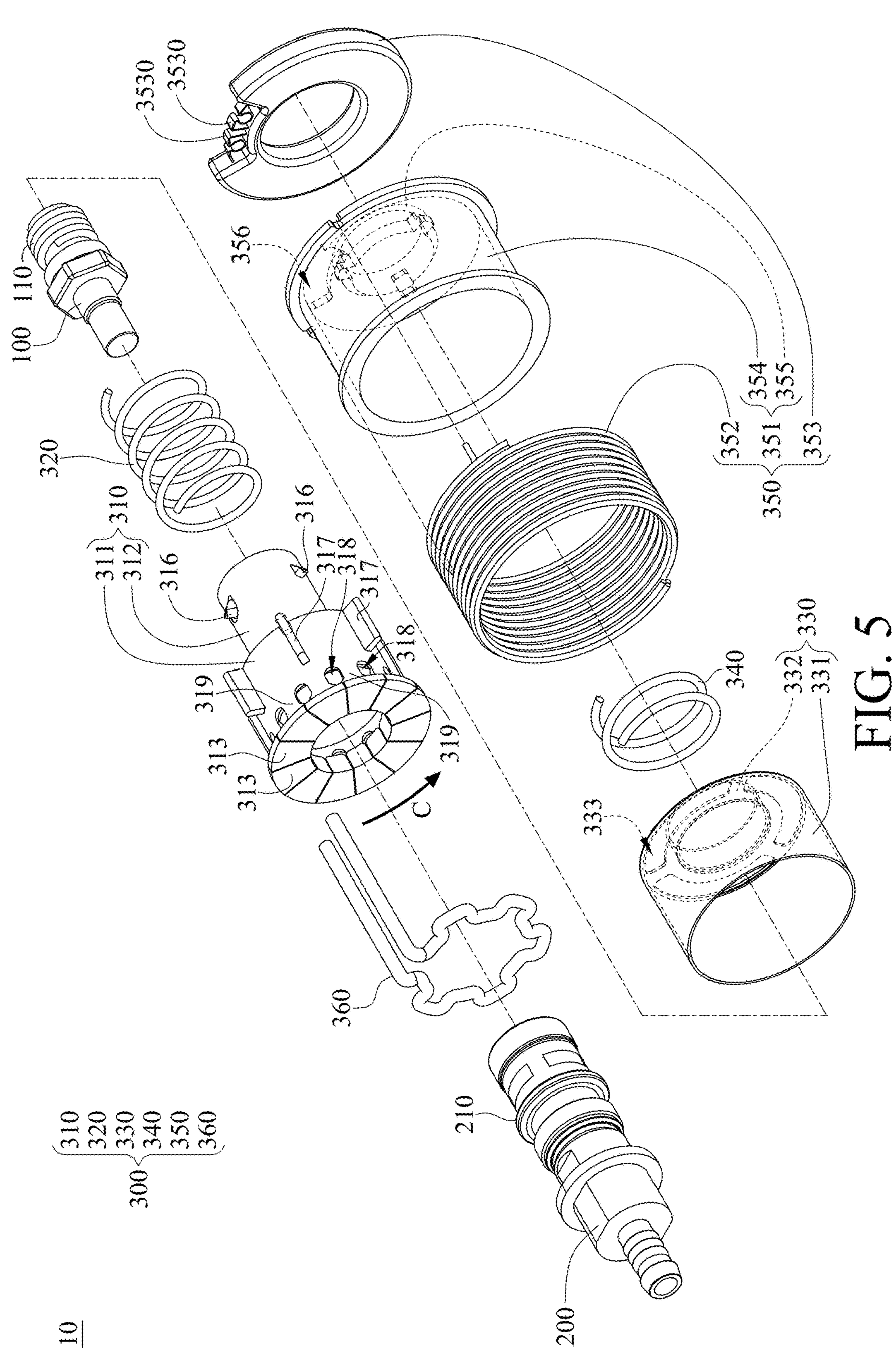
FIG. 5 is a perspective exploded view of the joint assembly in FIG. 1.
Figure 6:
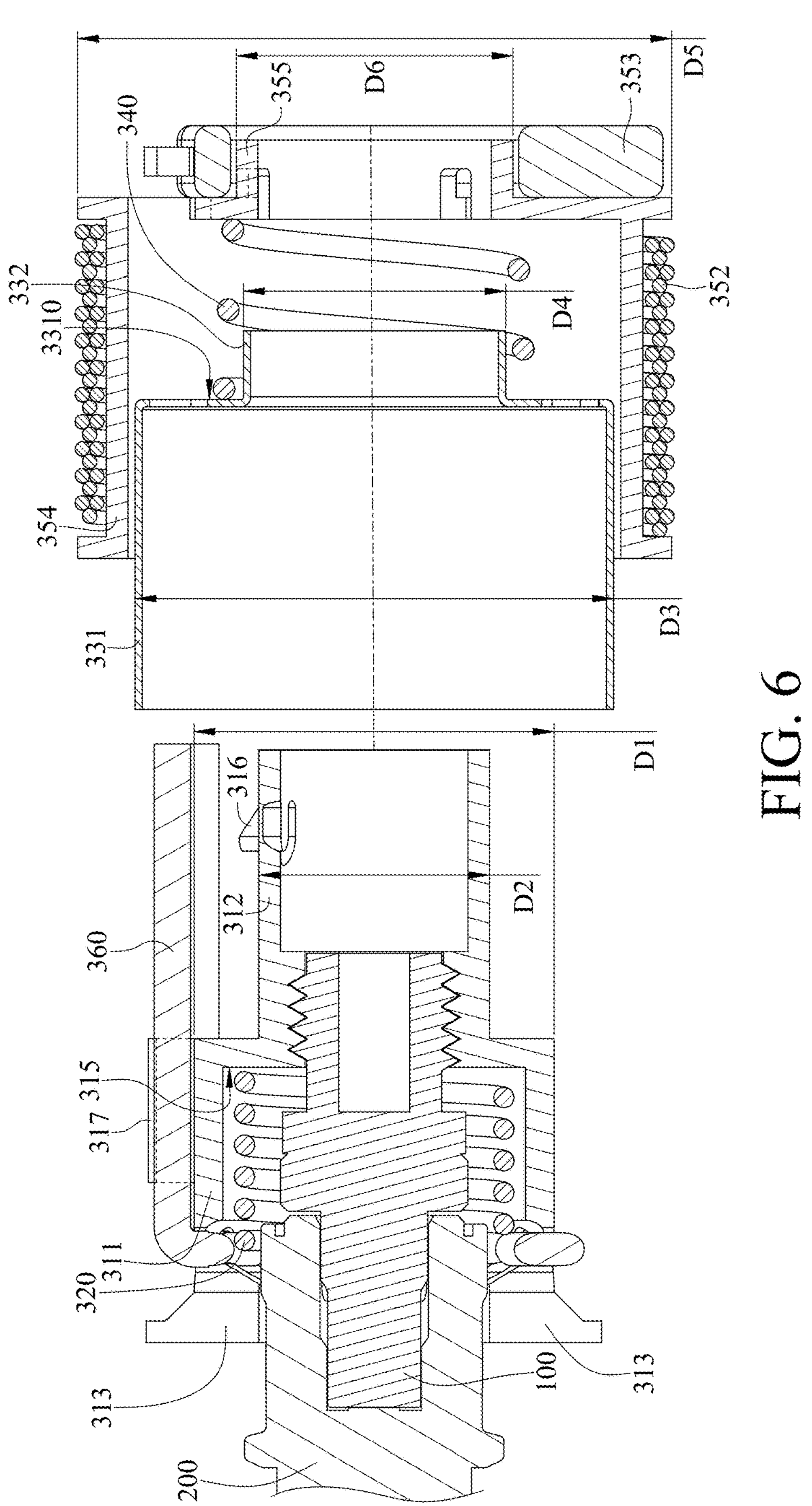
FIG. 6 is a side cross-sectional view showing that the joint assembly in FIG. 1 is partially exploded.

Please refer to FIGS. 1 to 6. FIG. 1 is a perspective view of a joint assembly 10 according to one embodiment of the disclosure. FIG. 2 is a perspective view showing that a joint auxiliary assembly 300 of the joint assembly 10 in FIG. 1 detaches a first joint 100 and a second joint 200 from each other. FIG. 3 is a perspective cross-sectional view of the joint auxiliary assembly 300 of the joint assembly 10 in FIG. 1. FIG. 4 is a side cross-sectional view of the joint assembly 10 in FIG. 1. FIG. 5 is a perspective exploded view of the joint assembly 10 in FIG. 1. FIG. 6 is a side cross-sectional view showing that the joint assembly 10 in FIG. 1 is partially exploded.

In this embodiment, the joint assembly 10 includes the first joint 100, the second joint 200 and the joint auxiliary assembly 300. For example, the first joint 100 is a male joint and has an outer threaded structure 110. The first joint 100 is fixed to, for example, a server chassis (not shown). For example, the second joint 200 is a female joint and has a protrusion 210. The first joint 100 and the second joint 200 are jointed to each other.

In this embodiment, an entire of the joint auxiliary assembly 300 is disposed outside the first joint 100 and the second joint 200. The joint auxiliary assembly 300 includes, for example, a mounting barrel 310, a first elastic component 320, a restricting barrel 330, a second elastic component 340, an electronic control assembly 350 and a liquid detecting unit 360.

In this embodiment, for example, the mounting barrel 310 includes a wide portion 311 and a narrow portion 312 connected to each other, and has a plurality of blocking portions 313. A diameter D1 of the wide portion 311 is larger than a diameter D2 of the narrow portion 312. The blocking portions 313 are located on a side of the wide portion 311 away from the narrow portion 312, and are, for example, blocking protrusions.

In addition, in this embodiment, a side of the wide portion 311 may have, for example, a plurality of openings 318 so that a plurality of elastic arms 319 is formed. The openings 318 are arranged along a circumferential direction C of the mounting barrel 310. The blocking portions 313 are respectively connected to the elastic arms 319.

Moreover, in this embodiment, for example, the narrow portion 312 has an inner threaded structure 314 and a plurality of mounting protrusions 316 radially protruding outwards. The outer threaded structure 110 and the inner threaded structure 314 are mated with each other so as to assemble the mounting barrel 310 to the first joint 100. However, the disclosure is not limited thereto. In other embodiments, the first joint may not have the outer threaded structure and the mounting barrel may not have the inner threaded structure, and the mounting barrel and the first joint may be assembled by a first engagement structure and a second engagement structure, such as a protrusion and a recess forming a snap fit.

The first elastic component 320 is, for example, a spring, and is disposed in the mounting barrel 310. Further, two opposite ends of the first elastic component 320 press respectively against the blocking portions 313 and an inner surface 315 of the wide portion 311 facing away from the narrow portion 312.

In this embodiment, the restricting barrel 330 may be made by, for example, magnetic material. The restricting barrel 330 includes, for example, a barrel portion 331 and an installing protrusion 332 connected to each other. A diameter D3 of the barrel portion 331 is larger than a diameter D4 of the installing protrusion 332. The barrel portion 331 has an outer surface 3310 connected to the installing protrusion 332. The outer surface 3310 has, for example, a plurality of openings 333. Also, the second elastic component 340 is, for example, a spring. Two opposite ends of the second elastic component 340 are respectively fixed to, for example, the outer surface 3310 of the barrel portion 331 of the restricting barrel 330 and the mounting protrusions 316 of the narrow portion 312. Thus, with the second elastic component 340, the restricting barrel 330 is movably disposed on the narrow portion 312 (e.g., movably disposed on the narrow portion 312 along an axial direction A of the mounting barrel 310). Additionally, the blocking portions 313 are surrounded by the barrel portion 331 and rest on the barrel portion 331. Also, the restricting barrel 330 may be moved along the axial direction A as shown in FIG. 2 to stop blocking the blocking portions 313 (i.e., to release the blocking portions 313).

In addition, in this embodiment, the wide portion 311 has, for example a plurality of pressing protrusions 317 radially protruding outwards. The pressing protrusions 317 press against an inner circumferential surface 3311 of the barrel portion 331 of the restricting barrel 330.

The electronic control assembly 350 is disposed on the mounting barrel 310, and is, for example, an electromagnetic assembly. In detail, the electronic control assembly 350 includes a magnetic core 351, a coil 352 and a circuit board 353. In this embodiment, for example, the magnetic core 351 is made by magnetic material, and includes a barrel portion 354 and an installing protrusion 355 connected to each other. A diameter D5 of the barrel portion 354 is larger than a diameter D6 of the installing protrusion 355. The coil 352 is covered or wound on the barrel portion 354. The circuit board 353 is sleeved on the installing protrusion 355, and is electrically connected to the coil 352. The narrow portion 312 of the mounting barrel 310, for example, is disposed through the installing protrusion 355. That is, the installing protrusion 355 of the magnetic core 351, for example, is sleeved on the narrow portion 312 of the mounting barrel 310. Also, the barrel portion 354 has, for example, a through hole 356.

The liquid detecting unit 360 is, for example, a non-electronic detecting unit such as a liquid detecting strip. At least a part of the liquid detecting unit 360 is disposed between the mounting barrel 310 and the restricting barrel 330, and is connected to the circuit board 353. Note the configuration of the liquid detecting unit 360 is not limited thereto. For example, in other embodiments, the liquid detecting unit may be any type of non-electronic detecting unit that has change after contacting a liquid. Alternatively, in other embodiments, the liquid detecting unit may be a humidity detecting unit (e.g., hydrometer) or any type of electronic component, electronic module or electronic assembly that has change after contacting a liquid.

In addition, the circuit board 353 may have one or more removable contacts 3530 allowing the liquid detecting unit 360 to be disposed thereon, thereby facilitating the replacement of the liquid detecting unit 360. In this embodiment, the liquid detecting unit 360, for example, is disposed through the openings 318 to be partially located in the wide portion 311 of the mounting barrel 310. With the openings 318, not only the elastic arms 319 are formed on the wide portion 311 to allow the blocking portions 313 to be restore to their original position by the elasticity of the elastic arms 319, but also the liquid detecting unit 360 is disposed or partially located in the wide portion 311 of the mounting barrel 310 and thus is facilitated to contact the working liquid leaked from the position where the first joint 100 and the second joint 200 are jointed. Note that in other embodiments, the wide portion of the mounting barrel may have one opening, and the liquid detecting unit may extend into the wide portion and extend back to the circuit board via the same opening. In still other embodiments, the wide portion of the mounting barrel may not have openings, and the liquid detecting unit may be disposed on the elastic arms of the wide portion.

Moreover, for example, the liquid detecting unit 360 is further disposed through one of the openings 333 of the barrel portion 331 of the restricting barrel 330 and the through hole 356 of the barrel portion 354 of the magnetic core 351.

Figure 7:
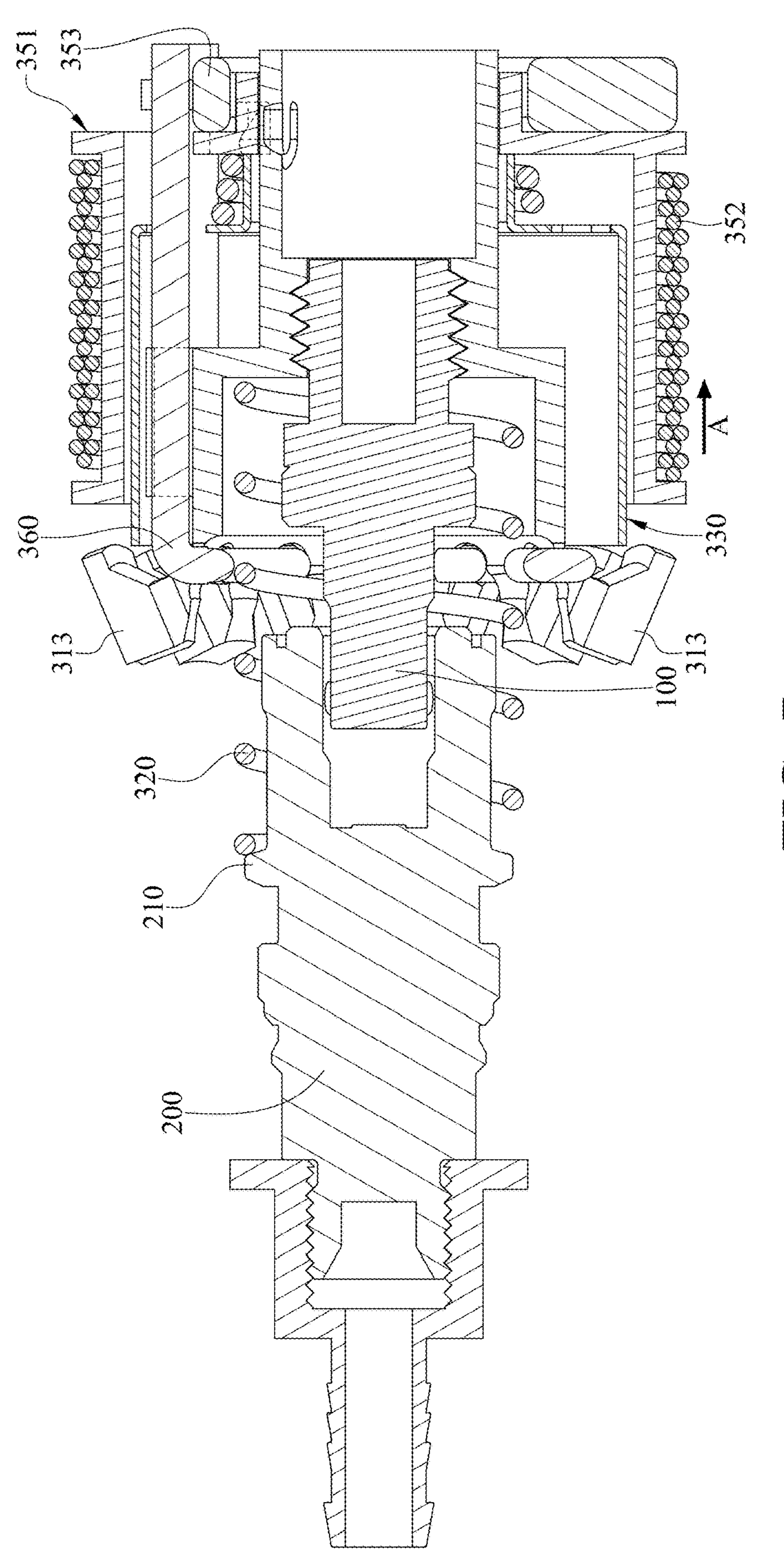
FIG. 7 is a side cross-sectional view showing that the joint auxiliary assembly of the joint assembly in FIG. 1 detaches the first joint and the second joint from each other.

Please refer to FIGS. 2, 5 and 7. FIG. 7 is a side cross-sectional view showing that the joint auxiliary assembly 300 of the joint assembly 10 in FIG. 1 detaches the first joint 100 and the second joint 200 from each other.

When the liquid detecting unit 360 contacts a liquid (e.g., the working liquid leaked from the position where the first joint 100 and the second joint 200 are jointed), the circuit board 353 controls the coil 352 and the magnetic core 351 to generate a magnetic field, so as to move the restricting barrel 330 away from the blocking portions 313 along the axial direction A. For example, moving the restricting barrel 330 along the axial direction A may denote that the restricting barrel 330 is moved toward the circuit board 353. Due to the movement of the restricting barrel 330, the restricting barrel 330 stops blocking the blocking portions 313 (i.e., releases the blocking portions 313) and the blocking portions 313 bend outwards, thereby allowing an end of the first elastic component 320 to be detached from the blocking portions 313 and push a protrusion 210 of the second joint 200. Thus, the first joint 100 and the second joint 200 are detached from each other. It can be understood that after the first joint 100 and the second joint 200 are detached from each other, the second joint 200 may be entirely detached from the first elastic component 320. Since the first elastic component 320 has a certain degree of rigidity, the sag of the first elastic component 320 is negligible after the second joint 200 is entirely detached from the first elastic component 320. Also, when the circuit board 353 stops the coil 352 and the magnetic core 351 from generating the magnetic field, the first elastic component 320 may be moved back to the position shown in FIG. 5 manually or by a tool, a jig or a fixture. At this time, the second elastic component 340 may help the restricting barrel 330 to be restored to the position shown in FIG. 5, thereby helping the blocking portions 313 to be restored to the position shown in FIG. 5.

In other embodiments, the joint auxiliary assembly may not include the second elastic component 340, and the restricting barrel may be held in position merely by the friction between the elastic arms and the restricting barrel, and the restricting barrel may be restored to its original position manually.

According to the joint auxiliary assembly and the joint assembly disclosed by above embodiments, the restricting barrel is movably disposed on the mounting barrel along the axial direction of the mounting barrel, the blocking portions are surrounded by the restricting barrel and rest on the restricting barrel, and at least a part of the liquid detecting unit is disposed on the mounting barrel and connected to the electronic control assembly. Thus, the electronic control assembly is allowed to move the restricting barrel based on the liquid detecting unit so as to move the blocking portions, thereby detaching the first joint and the second joint from each other by the first elastic component. Thus, when the working liquid is leaked from the position where the first joint and the second joint are jointed, the first joint and the second joint are detached from each other, and thus the leaked working liquid is prevented from damaging the adjacent electronic component(s). Meanwhile, the entire of the joint auxiliary assembly are disposed outside the first joint and the second joint, and thus the joint auxiliary assembly is not subjected to the pressure generated by the working liquid. Thus, comparing to conventional solenoid valves, the joint auxiliary assembly according to the disclosure not only immediately detaches the first joint and the second joint from each other when the leakage occurs, but also have smaller volume to allow the space utilization of the space accommodating the liquid system including the first joint and the second joint to be efficient.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A joint auxiliary assembly, configured to detach a first joint and a second joint, the joint auxiliary assembly comprising:

a mounting barrel, wherein a side of the mounting barrel has a plurality of blocking portions, and the mounting barrel is configured to be connected to the first joint;

a first elastic component, disposed in the mounting barrel, wherein an end of the first elastic component presses against the plurality of blocking portions;

a restricting barrel, movably disposed on the mounting barrel along an axial direction of the mounting barrel, wherein the plurality of blocking portions is surrounded by the restricting barrel and rests on the restricting barrel;

an electronic control assembly, disposed on the mounting barrel; and a liquid detecting unit, wherein at least a part of the liquid detecting unit is disposed on the mounting barrel, and the liquid detecting unit is connected to the electronic control assembly;

wherein the electronic control assembly is configured to move the plurality of blocking portions by moving the restricting barrel based on the liquid detecting unit.

2. The joint auxiliary assembly according to claim 1, wherein the electronic control assembly comprises a magnetic core, a coil and a circuit board, the coil is covered on the magnetic core, the circuit board is disposed on the magnetic core and electrically connected to the coil, the circuit board is connected to the liquid detecting unit, and the magnetic core is disposed on the mounting barrel.

3. The joint auxiliary assembly according to claim 2, wherein the mounting barrel comprises a wide portion and a narrow portion connected to each other, a diameter of the wide portion is larger than a diameter of the narrow portion, the plurality of blocking portions is located on a side of the wide portion, two opposite ends of the first elastic component press respectively against the plurality of blocking portions and an inner surface of the wide portion facing away from the narrow portion,, the restricting barrel is movably disposed on the narrow portion, and the magnetic core is sleeved on the narrow portion.

4. The joint auxiliary assembly according to claim 3, further comprising a second elastic component, wherein two opposite ends of the second elastic component are respectively fixed to the restricting barrel and the narrow portion.

5. The joint auxiliary assembly according to claim 4, wherein the narrow portion has at least one mounting protrusion radially protruding outwards, and two opposite ends of the second elastic component are respectively fixed to the restricting barrel and the at least one mounting protrusion.

6. The joint auxiliary assembly according to claim 4, wherein the restricting barrel comprises a barrel portion and an installing protrusion connected to each other, a diameter of the barrel portion is larger than a diameter of the installing protrusion, the plurality of blocking portions is surrounded by the barrel portion and rests on the barrel portion, and two opposite ends of the second elastic component are respectively fixed to an outer surface of the barrel portion connected to the installing protrusion and the narrow portion.

7. The joint auxiliary assembly according to claim 3, wherein the magnetic core comprises a barrel portion and an installing protrusion connected to each other, a diameter of the barrel portion is larger than a diameter of the installing protrusion, the circuit board is sleeved on the installing protrusion, the narrow portion of the mounting barrel is disposed through the installing protrusion, and the coil is wound on the barrel portion.

8. The joint auxiliary assembly according to claim 3, wherein the wide portion has a plurality of pressing protrusions radially protruding outwards, and the plurality of pressing protrusions rests on an inner circumferential surface of the restricting barrel.

9. The joint auxiliary assembly according to claim 1, wherein the liquid detecting unit is a liquid leak detection strip, a side of the mounting barrel has at least one opening to form a plurality of elastic arms, the plurality of blocking portions is respectively connected to the plurality of elastic arms, and the liquid detecting unit is disposed through the at least one opening to be at least partially located in the mounting barrel.

10. The joint auxiliary assembly according to claim 9, wherein the at least one opening comprises a plurality of openings, the plurality of openings is arranged along a circumferential direction of the mounting barrel, and the liquid detecting unit is disposed through the plurality of openings to be disposed in the mounting barrel.

11. A joint assembly, comprising:

a first joint;

a second joint, jointed to the first joint; and a joint auxiliary assembly, comprising:

a mounting barrel, wherein a side of the mounting barrel has a plurality of blocking portions, and the mounting barrel is connected to the first joint;

a first elastic component, disposed in the mounting barrel, wherein an end of the first elastic component presses against the plurality of blocking portions;

a restricting barrel, movably disposed on the mounting barrel along an axial direction of the mounting barrel, wherein the plurality of blocking portions is surrounded by the restricting barrel and rests on the restricting barrel;

an electronic control assembly, disposed on the mounting barrel; and a liquid detecting unit, wherein at least a part of the liquid detecting unit is disposed on the mounting barrel, and the liquid detecting unit is connected to the electronic control assembly;

wherein the electronic control assembly is configured to move the plurality of blocking portions by moving the restricting barrel based on the liquid detecting unit.

12. The joint assembly according to claim 11, wherein the electronic control assembly comprises a magnetic core, a coil and a circuit board, the coil is covered on the magnetic core, the circuit board is disposed on the magnetic core and electrically connected to the coil, the circuit board is connected to the liquid detecting unit, and the magnetic core is disposed on the mounting barrel.

13. The joint assembly according to claim 12, wherein the mounting barrel comprises a wide portion and a narrow portion connected to each other, a diameter of the wide portion is larger than a diameter of the narrow portion, the plurality of blocking portions is located on a side of the wide portion away from the narrow portion, two opposite ends of the first elastic component press respectively against the plurality of blocking portions and an inner surface of the wide portion facing away from the narrow portion, the restricting barrel is movably disposed on the narrow portion, and the magnetic core is sleeved on the narrow portion.

14. The joint assembly according to claim 13, wherein the joint auxiliary assembly further comprises a second elastic component, and two opposite ends of the second elastic component are respectively fixed to the restricting barrel and the narrow portion.

15. The joint assembly according to claim 14, wherein the narrow portion has at least one mounting protrusion radially protruding outwards, and two opposite ends of the second elastic component are respectively fixed to the restricting barrel and the at least one mounting protrusion.

16. The joint assembly according to claim 14, wherein the restricting barrel comprises a barrel portion and an installing protrusion, the installing protrusion is connected to a side of the barrel portion, the plurality of blocking portions is surrounded by the barrel portion and rests on the barrel portion, and two opposite ends of the second elastic component are respectively fixed to the installing protrusion and the narrow portion.

17. The joint assembly according to claim 13, wherein the magnetic core comprises a barrel portion and an installing protrusion connected to each other, a diameter of the barrel portion is larger than a diameter of the installing protrusion, the circuit board is sleeved on the installing protrusion, and the narrow portion of the mounting barrel is disposed through the installing protrusion.

18. The joint assembly according to claim 13, wherein the wide portion has a plurality of pressing protrusions radially protruding outwards, and the plurality of pressing protrusions rests on an inner circumferential surface of the restricting barrel.

19. The joint assembly according to claim 11, wherein the liquid detecting unit is a liquid leak detection strip, a side of the mounting barrel has at least one opening to form a plurality of elastic arms, the plurality of blocking portions is respectively connected to the plurality of elastic arms, and the liquid detecting unit is disposed through the at least one opening to be at least partially located in the mounting barrel.

20. The joint assembly according to claim 19, wherein the at least one opening comprises a plurality of openings, the plurality of openings is arranged along a circumferential direction of the mounting barrel, and the liquid detecting unit is disposed through the plurality of openings to be disposed in the mounting barrel.

* * * * *